United States Patent
Takano

(10) Patent No.: US 6,863,734 B2
(45) Date of Patent: Mar. 8, 2005

(54) SUBSTRATE PROCESSING APPARATUS AND METHOD FOR MANUFACTURING SEMICONDUCTOR DEVICE

(75) Inventor: Satoshi Takano, Tokyo (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 10/197,398

(22) Filed: Jul. 18, 2002

(65) Prior Publication Data

US 2003/0022402 A1 Jan. 30, 2003

(30) Foreign Application Priority Data

Jul. 25, 2001 (JP) ........................................ 2001-224998

(51) Int. Cl.⁷ .......................... H01L 21/00; C23C 16/00
(52) U.S. Cl. ...................... 118/725; 118/728; 118/715; 219/444.1; 392/416; 392/418; 156/345.52
(58) Field of Search ................................ 118/728, 725, 118/715; 156/345.52; 219/444.1; 392/416, 418

(56) References Cited

U.S. PATENT DOCUMENTS

| | | | | |
|---|---|---|---|---|
| 5,146,481 A | * | 9/1992 | Garg et al. | .................... 378/35 |
| 5,916,370 A | * | 6/1999 | Chang | ......................... 118/729 |
| 6,191,394 B1 | * | 2/2001 | Shirakawa et al. | ...... 219/444.1 |
| 2001/0055189 A1 | * | 12/2001 | Hagi | .......................... 361/234 |

FOREIGN PATENT DOCUMENTS

| | | | | |
|---|---|---|---|---|
| JP | 05102044 A | * | 4/1993 | ......... H01L/21/205 |
| JP | 6-260426 | | 9/1994 | |
| JP | 11329941 A | * | 11/1999 | ......... H01L/21/027 |

* cited by examiner

Primary Examiner—Gregory Mills
Assistant Examiner—Ram N Kackar
(74) Attorney, Agent, or Firm—Oliff & Berridge, PLC

(57) ABSTRACT

By indirectly monitoring a warping amount of a substrate, it is possible to examine causes easily when substrate processing such as deposition is performed with nonuniform in-plane temperature of the substrate and a defect in a substrate characteristic, for example in uniformity of a film thickness, is caused. In a substrate processing apparatus for processing a substrate, a substrate holding body for holding the substrate on its surface and a resistance heater for heating the substrate through the substrate holding body are provided. Radiation thermometers for measuring temperature of the substrate holding body, which has a correlation with a warping amount of the substrate, from its rear surface side are provided to the resistance heater. The substrate holding body is provided to be rotatable with respect to the radiation thermometers so that temperature information of the substrate holding body in a circumferential direction can be obtained. A calculator as a monitor for monitoring the warping amount of the substrate having a correlation with the temperature of the substrate holding body, based on the measured values of the radiation thermometers, is provided. A command for correcting the warping amount is sent to a control means, based on the warping amount determined by the calculator, to control the resistance heater, as necessary.

2 Claims, 8 Drawing Sheets

Fig.6A            Fig.6B
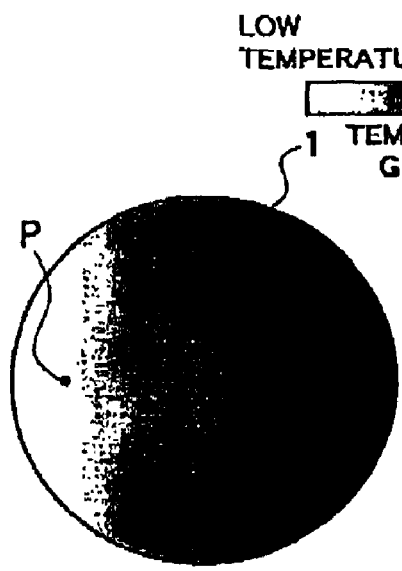
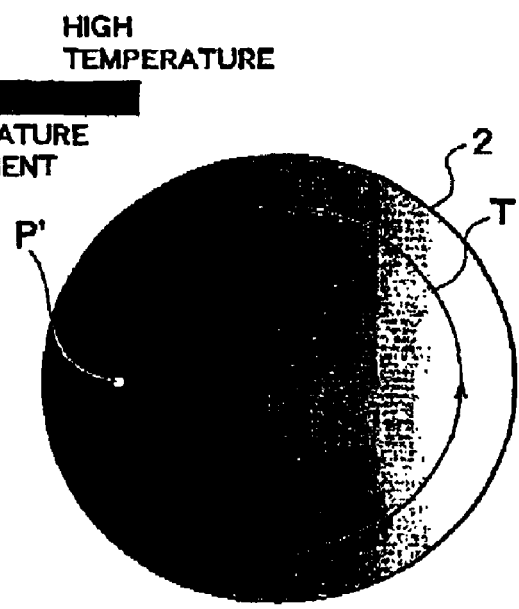
Fig.7
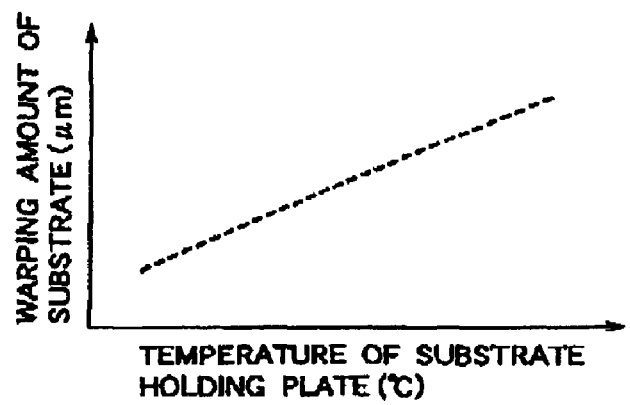

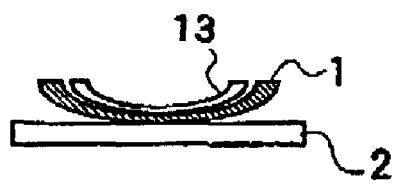 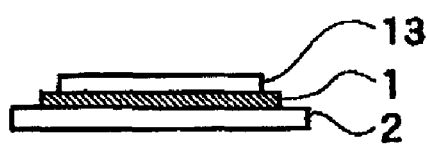
Fig.8A    Fig.8B
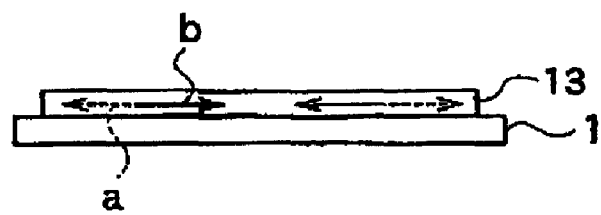
Fig.9
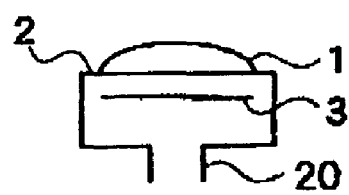
Fig.10
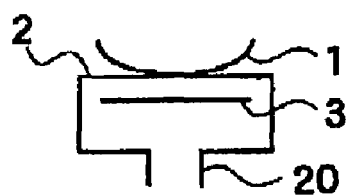
Fig.11

SUBSTRATE PROCESSING APPARATUS AND METHOD FOR MANUFACTURING SEMICONDUCTOR DEVICE

BACKGROUND OF THE INVENTION

1. Field of the Invention

The present invention relates to a substrate processing apparatus and a method for manufacturing a semiconductor device and, more particularly, to those which monitor or control a warping amount of a substrate.

2. Description of the Related Art

Generally, in a sheet-type substrate processing apparatus, a substrate is processed while the substrate is forcedly sucked onto a substrate holding plate. In this case, when an adhesion of the substrate onto the substrate holding plate is not controlled, a problem is caused that a substrate characteristic of the substrate of the low adhesion is deteriorated seriously when it is transferred to a subsequent deposition process.

Specifically, as shown in FIG. 14, the sheet-type substrate processing apparatus performs processing such as deposition on the substrate by spraying a gas in a shower state from a gas dispersing plate 5 which is disposed above a substrate 1, while the substrate 1 is sucked and held on a substrate holding plate 2 which is heated by a resistance heater 3. A surface of the resistance heater 3 is kept at set temperature at all times.

It should be mentioned that, when warping amounts $d_1$ and $d_2$, which are space distances between the substrate 1 and the substrate holding plate 2 and show the adhesion, change, heat of the substrate holding plate 2, which is uniformly heated by the resistance heater 3 in the same state at all times, is not conducted to the substrate 1 uniformly, and the following disadvantages due to unevenness of a temperature distribution which depends on the warping amount d of the substrate (a generic name for $d_1$ and $d_2$) occur in a plane of the substrate.

Note that the warping amount of the substrate means a greatest value of a gap between a surface of the substrate holding plate 2 and a rear surface of the substrate 1, which is formed when the substrate 1 is deformed while the substrate 1 is held on the surface of the substrate holding plate 2 and a portion where the substrate 1 is not adhered to the substrate holding plate 2 is generated as a result.

As the distance d between the substrate 1 and the substrate holding plate 2 becomes longer, a heat transfer rate from the substrate holding plate 2 becomes worse, and temperature variations are generated in the in-plane temperature of the substrate depending on the distance d. Therefore, in the case of $d_1 > d_2$, the temperature of the substrate near $d_2$ is higher than the temperature of the substrate near $d_1$.

According to the above technique of sucking and holding the substrate on the substrate holding plate, the entire surface of the substrate is not always sucked uniformly on the substrate holding plate. Since the process substrate undergoes a thermal treatment process including a plurality of deposition processes to be made into a targeted semiconductor substrate, a lamination number of deposition and heat history of the substrate increase as the processing proceeds, and as a result, it is possible that such a substrate easily has a plastic deformation amount of 100 μm or more warping amount d of the substrate, which is explained in FIG. 14.

When the adhesion of an end part of the substrate is not controlled, in other words, when the warping amount of the substrate during the processing is not controlled, the substrate characteristic after the processing receives a bad influence as a matter of course. This appears in, for example, deterioration in uniformity of a film thickness in thin film forming processing. Under present circumstances, there is no technique for controlling the warping amount of the substrate (that is, a nonuniform amount of temperature), and hence examining causes when a defect is caused in the substrate characteristic is troublesome. Therefore, there are demands for a technique for quantitatively controlling and monitoring these.

Incidentally, it is known that positions to measure temperature and a heating method for preventing generation of a slip in the substrate (wafer) are explained in the substrate heating technique disclosed in Japanese Patent Laid-Open No. Hei 6-260426. Although it explains that a contact area between the substrate and a substrate holding body (holder) cannot be controlled, the substrate is deformed and the contact area between the substrate and the substrate holding body changes in increasing the temperature, and therefore, an in-plane temperature difference is caused and the slip is generated in the substrate because of an influence of temperature of the outermost periphery of the substrate. Hence, the temperature is measured at a plurality of points which are positioned on the outer periphery part and on the points located 70% or higher of the radius apart from the center of the substrate, and heating of a heater is controlled so that a temperature difference between the respective temperature measuring points is 5° C. or lower. Thus, the heating treatment free from the generation of the slip without depending on uniformity of heating density of the heater and the contact area between the substrate and the substrate holding body is realized.

Moreover, as to control of a warp of the substrate by vacuum sucking, it is possible to control the warping amount of the substrate if a pressure difference is further increased and a sucking rate is increased, but it is difficult technically because the mechanism becomes complicated, Under the present circumstances, the warp is still generated even when the substrate is sucked with a large pressure difference of 300 to 500 Pa.

The present invention moves a step forward from that the temperature of the substrate changes according to a contact state between the substrate and the substrate holding body, and is made from the perspective that the temperature of the substrate holding body changes according to the contact state and there is a correlation between the temperature of the substrate holding body and the warping amount of the substrate.

SUMMARY OF THE INVENTION

It is an object of the present invention to eliminate the above-described disadvantages of the conventional art and to provide a substrate processing apparatus and a method for manufacturing a semiconductor device which can easily examine causes of a defect due to a warping amount by indirectly monitoring the warping amount of a substrate.

A first invention is a substrate processing apparatus which processes a substrate, comprising a substrate holding body which holds the substrate, a heater which heats the substrate through the substrate holding body, a thermometer which measures temperature of the substrate holding body from a rear surface side of the substrate holding body, which is opposite to a surface side on which the substrate is held, and a monitor which monitors a warping amount of the substrate having a correlation with the temperature of the substrate holding body, based on the measured value of the thermometer.

There is the correlation between the temperature of the substrate holding body and the warping amount of the substrate. The warping amount of the substrate becomes small when the temperature of the substrate holding body is low, whereas the warping amount of the substrate becomes large when the temperature of the substrate holding body is high. Therefore, when the temperature of the substrate holding body is measured by the thermometer and the warping amount of the substrate is monitored by the monitor based on the measured value, a correlation between the warping amount of the substrate and a defect in substrate processing can be figured out and causes of the defect can be examined.

Since the temperature of the substrate holding body is measured from the rear surface side of the substrate holding body by the thermometer, a sensor part of the thermometer is covered with the substrate holding body, and therefore, it is possible to avoid it from being exposed to processing space. Hence, a film is not adhered to the sensor part of the thermometer and, as a result, it is possible to increase a long-term reliability as the apparatus.

The monitor can be structured by a calculator which displays and outputs the temperature of the substrate holding body in relation to the warping amount of the substrate, determines the warping amount of the substrate by calculation using a correlation expression which is prepared in advance from the measured value of the temperature of the substrate holding body, or calculates the warping amount of the substrate by using a lookup table which is prepared in advance for determining the warping amount of the substrate with respect to the temperature of the substrate holding body.

A second invention is the substrate processing apparatus according to the first invention, further comprising a rotator which rotates the substrate holding body relatively to the thermometer, and wherein the thermometer measures the temperature of the rear surface of the substrate holding body in a circumferential direction, which is rotated relatively to the thermometer by the rotator, and wherein the monitor monitors the warping amount of the substrate in the circumferential direction, based on the measured value of the thermometer.

Since the warping amount of the substrate in the circumferential direction is monitored by measuring the temperature of the rear surface of the substrate holding body, which includes the rotator and rotates relatively, in the circumferential direction, it is possible to figure out the correlation between the warping amount of the substrate and the defect in the substrate processing in the circumferential direction of the substrate as well.

A third invention is the substrate processing apparatus according to the first invention, wherein the monitor is comprised of a calculator which determines the warping amount of the substrate according to a predetermined algorithm, from the temperature of the substrate holding body measured by the thermometer.

The calculator which determines the warping amount of the substrate includes not only the one which determines it by calculation based on a predetermined expression, but also the one which determines it by using a lookup table which shows the warping amount of the substrate with respect to the temperature at the rear surface of the substrate holding body obtained in advance.

Since the warping amount of the substrate is determined by using the calculator, it is possible to figure out the correlation between the warping amount of the substrate and the defect in the substrate processing as data. Further, since the calculator is used, it is possible to easily determine the warping amount of the substrate from the temperature of the substrate holding body. Especially when it is determined by using the lookup table, it is not necessary to perform calculation in contrast to the case using the expression, and hence quick control is made possible.

A fourth invention is a substrate processing apparatus which processes a substrate, comprising a substrate holding body which holds the substrate, a heater which heats the substrate through the substrate holding body, a thermometer which measures temperature of the substrate or the substrate holding body, a calculator which determines a warping amount of the substrate having a correlation with the measured temperature, based on the measured value of the thermometer, and a warp controller which controls a warping state of the substrate by controlling the heater based on the warping amount determined by the calculator.

The processing is performed while controlling the warping state of the substrate by controlling the heater by the warp controller and adjusting a heating condition of the substrate holding body, and hence an optimum warping state of the substrate which is necessary for the processing can be realized.

A fifth invention is the substrate processing apparatus according to the fourth invention, wherein the substrate is processed while maintaining the predetermined warping state controlled by the warp controller.

Since the substrate is processed while maintaining the predetermined warping state on purpose, it is possible to offset stress generated in the substrate and to avoid generation of unnecessary stress in the substrate, when the substrate processing is completed and the substrate is back to room temperature. Especially when the processing is deposition processing, the unnecessary stress is not generated in the film and film peeling can be prevented.

A sixth invention is a method for manufacturing a semiconductor device by forming a film on a substrate held on a surface of a substrate holding body, comprising heating the substrate through the substrate holding body, measuring temperature of the substrate holding body from a rear surface side, and monitoring a warping amount of the substrate having a correlation with the temperature of the substrate holding body, based on the measured value.

There is the correlation between the temperature at the rear surface of the substrate holding body and the warping amount of the substrate. Therefore, when the warping amount of the substrate is monitored based on the measured value of the temperature of the substrate holding body, it is possible to figure out a correlation between the warping amount of the substrate and a defect in deposition. Further, since the temperature of the substrate holding body is measured from the rear surface side of the substrate holding body, it is not necessary to expose a temperature sensor part to the processing space, and hence the film is not adhered to the sensor part and a high reliability on a long-term basis can be obtained.

A seventh invention is the method for manufacturing the semiconductor device according to the sixth invention, wherein, in measuring the temperature of the substrate holding body from the rear surface side, the temperature of the rear surface of the substrate holding body is measured in a circumferential direction, to monitor the warping amount of the substrate in the circumferential direction, which has the correlation with the temperature of the substrate holding body, based on the measured value.

Since the warping amount of the substrate in the circumferential direction is monitored by measuring the temperature of the rear surface of the substrate holding body in the circumferential direction, it is possible to figure out the correlation between the warping amount of the substrate and the defect in the substrate processing in the circumferential direction of the substrate as well.

An eighth invention is the method for manufacturing the semiconductor device according to the sixth invention, wherein, in a method of monitoring the warping amount of the substrate, the warping amount of the substrate is determined according to a predetermined algorithm, from the measured temperature of the substrate holding body.

The method which determines the warping amount of the substrate includes not only the one which determines it by calculation based on a predetermined expression, but also the one which determines it by using a lookup table which shows the warping amount of the substrate with respect to the temperature at the rear surface of the substrate holding body obtained in advance.

Since the warping amount of the substrate is determined, it is possible to figure out the correlation between the warping amount of the substrate and the defect in the substrate processing as data. Further, it is possible to easily determine the warping amount of the substrate from the temperature of the substrate holding body. Especially when it is determined by using the lookup table, it is not necessary to perform calculation in contrast to the case using the expression, and hence quick control is made possible.

A ninth invention is a method for manufacturing a semiconductor device by forming a film on a substrate, comprising holding the substrate on a surface of a substrate holding body, heating the substrate through the substrate holding body, measuring temperature of the substrate or the substrate holding body, determining a warping amount of the substrate having a correlation with the measured value based on the measured value, controlling a warping state of the substrate by adjusting a heating amount of the substrate based on the determined warping amount, and forming the film on the substrate in the controlled warping state.

Since the warping state of the substrate is controlled by adjusting the heating amount of the substrate according to the warping amount, it is possible to realize the optimum warping state of the substrate which is necessary for the processing.

A tenth invention is the method for manufacturing the semiconductor device according to the ninth invention, wherein, in forming the film on the substrate in the controlled warping state, the film is formed while maintaining a predetermined warping state.

Since the film is formed on the substrate while maintaining the predetermined warping state on purpose, it is possible to offset stress generated in the substrate and to avoid generation of unnecessary stress in the substrate, when the deposition is completed and the substrate is back to room temperature. Therefore, the unnecessary stress is not generated in the film and film peeling can be prevented.

BRIEF DESCRIPTION OF THE DRAWINGS

FIG. 6A and FIG. 6B are explanatory views showing dependences of in-plane temperature distribution of the substrate and the substrate holding plate on the warping amount of the substrate;

FIG. 7 is a characteristic view showing a correlation between the temperature of the substrate holding plate and the warping amount of the substrate;

FIG. 8A and FIG. 8B are explanatory views showing states of the substrate and deposition, during processing of increasing the temperature and under room temperature;

FIG. 9 is an explanatory view showing a principle of preventing film peeling;

FIG. 10 is an explanatory view showing the case where the substrate is warped protrusively;

FIG. 11 is an explanatory view showing the case where the substrate is warped concavely;

DETAILED DESCRIPTION OF THE PREFERRED EMBODIMENTS

Hereinafter, explanations about embodiments of the present invention which are applied to a sheet-type substrate processing apparatus will be given. It should be noted that, although an apparatus of a single wafer type which performs processing for each substrate will be explained as the sheet type, it is not limited to the single wafer type and the embodiments of the present invention may be applied to an apparatus which performs processing of about two to five or more substrates.

Figure 12:
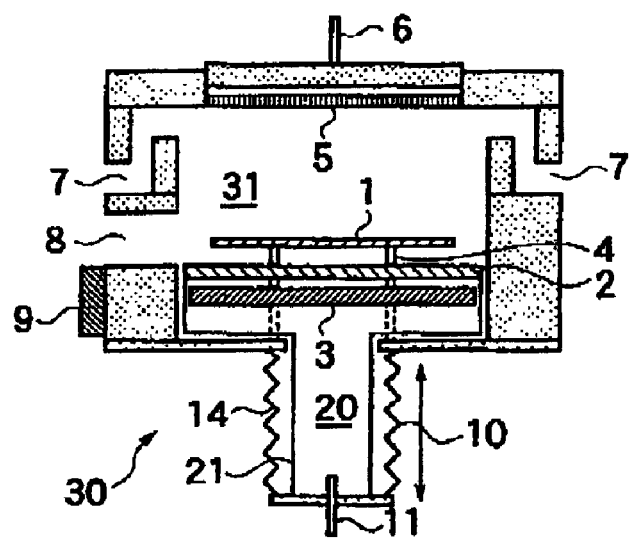
FIG. 12 is a schematic sectional view of a sheet-type substrate processing apparatus being the premise of the embodiment.
Figure 13:
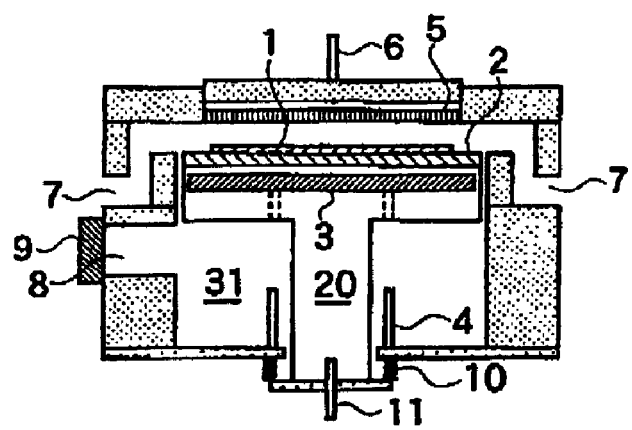
FIG. 13 is a schematic sectional view of the sheet-type substrate processing apparatus being the premise of the embodiment.
Figure 14:
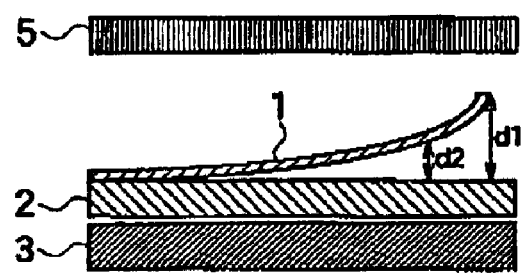
FIG. 14 is an explanatory view showing a nonuniform generation model of in-plane substrate temperature.

FIG. 12 and FIG. 13 are schematic sectional views of the sheet-type substrate processing apparatus which performs thin film formation and heat treatment and is the premise of the embodiments.

The apparatus includes a hermetically structured processing container 40. The processing container 40 includes a substrate inserting port 8 through which a semiconductor substrate 1 such as a silicon wafer is carried from a carrying chamber (not shown) into a processing chamber 31 inside the processing container 40, and an opening and closing valve 9 for performing atmosphere isolating between the carrying chamber and the processing chamber 31. Additionally, a gas supply port 6 which can supply a gas of a predetermined type, flow volume and ratio into the processing chamber 31 and an exhaust port 7 for exhausting the supplied gas are provided. Above the processing chamber 31 at which the gas supply port 6 is provided, a gas dispersing plate 5 for suppressing deviation of a supply amount is provided facing a surface of the substrate to be processed.

Inside the processing chamber 31, a substrate holding plate 2 as a substrate holding body for holding the substrate 1 and a heater unit 20 for heating the substrate 1 through the substrate holding plate 2 are provided. The substrate holding plate 2 sucks and holds the substrate 1 on its surface and makes heat from a resistance heater 3 as a heater uniform while sucking and holding the substrate.

The heater unit 20 is structured by a hollow body, and includes a substrate holding plate mounting part on which the substrate holding plate 2 is mounted at its upper part, and a cylindrical supporting shaft 21 which advances and retreats through an opening provided at the center of the bottom of the processing container 40 at its lower part. The heater unit 20 is made to have the hermetic structure when the substrate holding plate 2 is mounted on the substrate holding plate mounting part. Inside the hollow body, the resistance heater 3 which can heat the substrate 1 to predetermined temperature through the substrate holding plate 2 is provided. An evacuating line 11 is provided to the hermetically structured hollow body, and when it evacuates the heater unit 20, the substrate 1 is forcedly sucked on the surface of the substrate holding plate 2. A plurality of holes or grooves are formed in the substrate holding plate 2 in order to vacuum-suck the substrate thereon.

The supporting shaft 21 of the heater unit 20 is coupled to a hoisting and lowering mechanism 10, whereby the heater unit 20 is provided to be ascendable and descendable into/out of the processing chamber 31. The supporting shaft 21 is sealed by bellows 14. The hoisting and lowering mechanism 10 allows multistage adjustment of the heater unit 20 at different positions in a vertical direction inside the processing chamber 31, in respective steps of carrying the substrate, processing the substrate, and so on. Substrate supporting pins 4 for temporarily supporting the carried-in substrate 1 are provided to the substrate holding plate 2 to be freely protruded and retracted corresponding to the ascent and descent of the heater unit 20.

Figure 3:
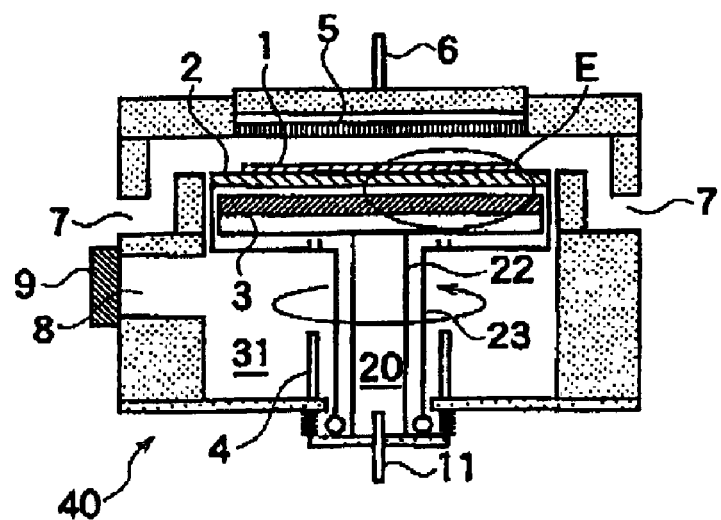
FIG. 3 is a schematic sectional view of a sheet-type substrate processing apparatus according to the embodiment.

According to the above-described structure, although the substrate 1 is sucked and held on the substrate holding plate 2, the entire surface of the substrate is not always sucked uniformly on the substrate holding plate 2 even when it is sucked and held thereon, and it is impossible to control a warping amount of the substrate. Hence, a first embodiment is structured as shown in FIG. 3 by changing a part of the structures in FIG. 12 and FIG. 13 so that the warping amount of the substrate can be controlled. Incidentally, in FIG. 3, the same numerals are given to designate the parts corresponding to those in FIG. 12 and FIG. 13, and explanations thereof are omitted.

According to the embodiment shown in FIG. 3, a heater unit 20 which is not rotatable in FIG. 12 and FIG. 13 is made to be rotatable, and temperature of a substrate holding plate 2 is made to be measurable. Namely, the aforementioned cylindrical supporting shaft 21 is changed to a cylindrical rotating shaft 23 and the heater unit 20 is provided to be rotatable around the rotating shaft 23 so that the substrate holding plate 2 can be rotated at an arbitrary speed while holding the substrate 1. Meanwhile, a resistance heater 3 provided inside the heater unit 20 is fixed, and is supported by a supporting shaft 22 which is inserted into the cylindrical rotating shaft 23. Thus, the substrate holding plate 2 is made to be rotatable and the resistance heater 3 is made to be fixed, thereby allowing the substrate holding plate 2 to rotate relatively to the resistance heater 3. Moreover, since the heater unit 20 is made to be rotatable, the heater unit 20 is made to be ascendable and descendable and to be rotatable and, although not illustrated, a known means can be adopted for such a composite mechanism having functions of ascending and descending and rotating. Furthermore, although not illustrated in FIG. 3, thermometer for measuring temperature of the substrate holding body 2 are provided to the resistance heater 3. This thermometer will be explained with reference to FIG. 1.

Figure 1:
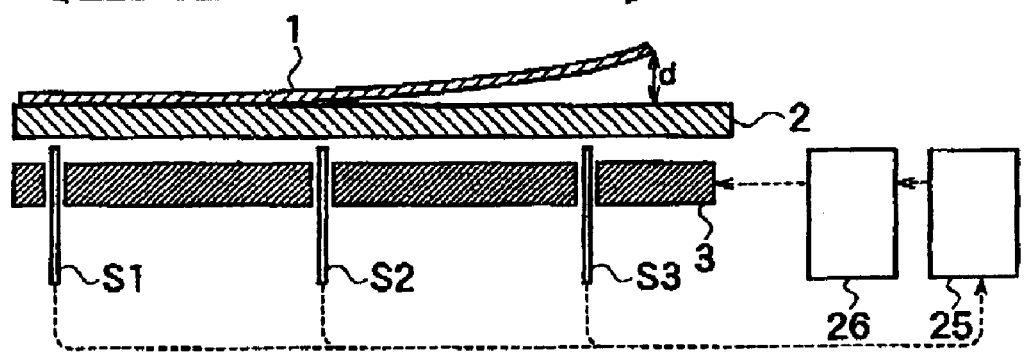
FIG. 1 is a partially enlarged view of a processing chamber according to an embodiment.

FIG. 1 is an enlarged view of an E portion which corresponds to a radial distance of the substrate in FIG. 3. As shown in FIG. 1, radiation thermometers S1, S2 and S3 are, for example, installed on the resistance heater 3, as the thermometer of the substrate holding plate 2. The radiation thermometers S1, S2 and S3 are provided so that these sensor parts face a rear surface of the substrate holding plate 2, and they can measure the temperature of the substrate holding plate 2 from the rear surface side and monitor the temperature on the rear surface of the substrate holding plate 2 from the measured values. The radiation thermometer should be installed at not less than two points, that is, at the center pan of the substrate and near the end part of the substrate. It is more preferable to install another radiation thermometer at the midpoint between the above two points, in order to control the warping amount of the substrate more strictly as will be described later. Incidentally, the thermometer is not limited to the radiation thermometer. For example, a thermocouple and the like may be used.

The radiation thermometers S1, S2 and S3 measure the temperature of nearly the center part, end part and midpoint between the center part and the end part of the substrate holding plate 2 from the rear surface side of the substrate holding plate 2, as described above. The measured values are respectively given to a calculator 25. The calculator 25 performs calculation of the warping amount based on the respective measured values, determines a command value for correcting the warping amount by calculation after that, and supplies the command value to a control means 26. The control means 26 controls the resistance heater 3 based on the command value supplied from the calculator 25, and controls a warping state of the substrate as a result.

It is suitable to simply monitor the temperature of the substrate holding plate 2 as the warping amount of the substrate 1 having a correlation with the temperature, based on the measured values of the radiation thermometers S1, S2 and S3. It is also suitable to move the monitoring a step forward to control the warping amount, as described above. In the former, the calculator 25 makes a monitor and its output becomes the warping amount. In the latter, the control means 26 makes a warp controller.

The resistance heater 3 may be a unit body type as shown in the drawing, but it may be a heater of a separated type which consists of a plurality of heater parts. When the heater of the separated type is used, it is suitable to control a plurality of the heater parts independently according to the command values which correspond to a plurality of the heater parts.

Figure 2:
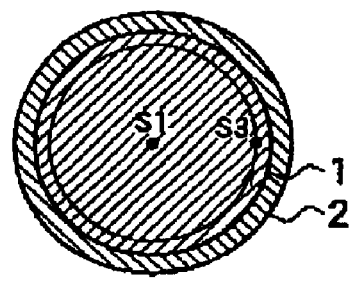
FIG. 2 is an explanatory view of temperature measurement loci of thermometers by rotating a substrate holding plate, according to the embodiment.

FIG. 2 is a projection view in which loci of the radiation thermometers S1 and S3 are projected onto the rear surface of the substrate holding plate 2, when the substrate holding plate 2 is rotated. In this projection view, a holding area of the substrate 1 is diagonally shaded for a reference purpose. When the substrate 1 and the substrate holding plate 2 rotate, the radiation thermometer S1 which is at the center part of the substrate fixedly measures the temperature of the center part of the substrate holding plate 2 from the rear surface side. The radiation thermometer S3 which is near the end part of the substrate measures the temperature at the peripheral edge part of the substrate holding plate 2 from the rear surface side, by describing a circular measurement locus. In this drawing, when a revolution speed of the substrate is 10 rpm, the radiation thermometer S3 repeatedly measures the temperature at the same point on the circular measurement locus with a six sec interval.

Hereinafter, processing of the substrate processing apparatus being structured as above will be explained.

First, pressures inside the carrying chamber and the processing chamber 31 are adjusted to predetermined pressures, respectively. The pressure is adjusted by supplying a predetermined flow volume of an inert gas, such as $N^2$ and Ar, which does not react with the surface of the substrate to the respective chambers, and adjusting conductance of the exhaust port 7 (not shown). For example, the pressures inside the respective chambers are made to be approximately 13300 Pa (100 Torr) in this example, but it is preferable to determine the pressures depending on the thin film formation, heat treatment pressure and the like of the substrate 1 to find out optimum values for each of substrate processing conditions.

Next, an opening and closing valve 9 is opened, and the substrate 1 is inserted from the carrying chamber into the processing chamber 31 through a substrate inserting port 8, and thereafter, the substrate 1 is temporarily supported by substrate supporting pins 4 (refer to FIG. 12). Incidentally, it is preferable to monitor a pressure difference between the carrying chamber and the processing chamber 31 in opening the opening and closing valve 9 so as not to cause generation of particles due to a pressure change. After inserting the substrate 1, the opening and closing valve 9 is closed to perform the atmosphere isolating between the processing chamber 31 and the carrying chamber.

Then, as shown in FIG. 3, the heater unit 20 is hoisted by a hoisting and lowering mechanism 10 so that the substrate 1 is transferred from the substrate supporting pins 4 onto the substrate holding plate 2, and the substrate 1 is sucked and held on the substrate holding plate 2. Further, the heater unit 20 is hoisted and the substrate 1 is disposed at a thin film forming position which is near a gas dispersing plate 5.

Thereafter, after opening a valve (not shown) connected to an evacuating line 11, the pressure inside the heater unit 20 is reduced to be lower than that of the processing chamber 31. By sucking the rear surface of the substrate by a plurality of the holes or grooves which are formed in the substrate holding plate 2, the substrate 1 is forcedly sucked onto the substrate holding plate 2. Then, the heater unit 20 is rotated in this state, to thereby rotate the substrate holding plate 2 and the substrate 1. A revolution speed of the heater unit 20 is controlled to be 10 rpm in this example.

The temperature of the resistance heater 3 for heating the substrate 1 is set in advance before the substrate is carried in so that the temperature of the substrate 1 becomes targeted processing temperature in the state shown in FIG. 3, and the substrate 1 is stabilized until its temperature becomes the targeted processing temperature in this state. When the temperature of the substrate is stabilized, a reactive gas for forming a desired film is introduced from the gas supply port 6 into the processing chamber 31 through the gas dispersing plate 5, thereby forming a thin film on the surface of the substrate 1.

When a time necessary for forming the thin film has passed, the supply of the reactive gas is stopped immediately, and remaining gaseous components of the reactive gas are exhausted from the exhaust port 7. Thereafter, the substrate 1 is discharged from the processing chamber 31 into the carrying chamber following a reverse procedure to the one described above, and the above operation is repeated until the processing for a predetermined number of the substrates is finished.

By the way, since rotating operation of the substrate holding plate 2 during the deposition processing is performed after the substrate is sucked, temperature data in a circumferential direction of the substrate holding plate 2 can be obtained after when the substrate is sucked. By using the temperature data which is actually obtained, a correlation between the temperature of the substrate holding plate 2 and the warping amount of the substrate will be explained. Incidentally, the temperature data is obtained when the temperature of the substrate almost reaches the targeted temperature after performing the rotating operation. Further, warping data shown in FIG. 4 to FIG. 6B is an example when only a half of the substrate is warped.

[Correlation Between the Temperature of the Substrate Holding Plate and the Warping Amount of the Substrate]

Figure 4:
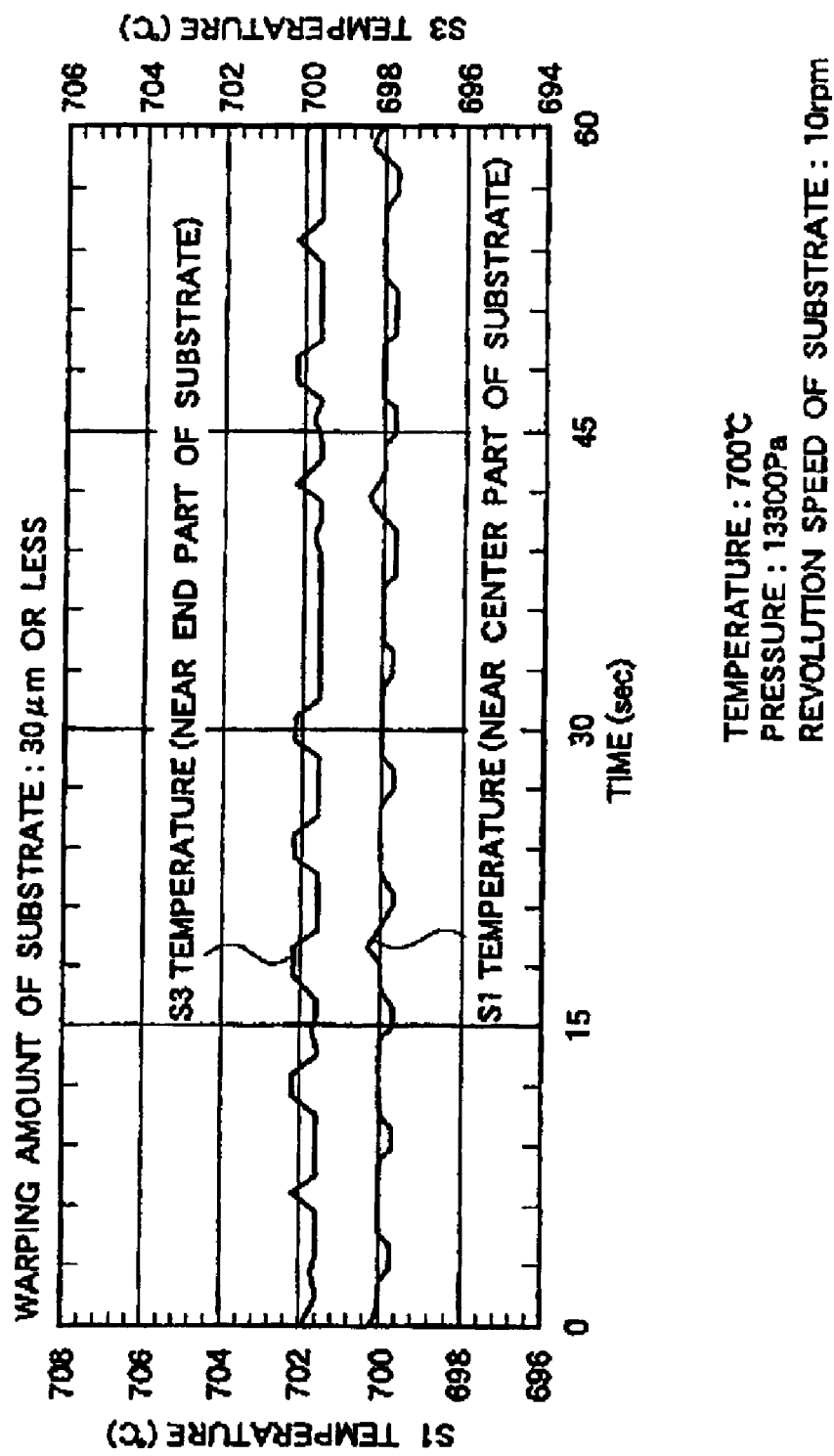
FIG. 4 is an explanatory view showing a dependence of temperature distribution of the substrate holding plate on a warping amount of a substrate.

First, a first sample whose warping amount of the substrate is small but whose amount is unknown is used to obtain the temperature of the substrate holding plate 2 from its rear surface side. FIG. 4 shows time transitions of temperature S1 of the substrate holding plate 2 near the center part of the substrate, which is measured by the radiation thermometer S1, and temperature S3 of the substrate holding plate 2 near the end part of the substrate, which is measured by the radiation thermometer S3. Incidentally, as to the condition of the processing chamber 31 at this time, its pressure is set to be 13300 Pa, and control temperature of the resistance heater 3 is set so that the substrate 1 is heated to 700° C. In this chart, the time transitions of the temperature S1 of the substrate holding plate 2 near the center part of the substrate and the temperature S3 of the substrate holding plate 2 near the end part of the substrate have almost the same temperature variations around 700° C. When this sample is cooled after the deposition processing and the warping amount of the substrate is measured by a known means, the warping amount of the substrate is equal to or smaller than 30 μm. Moreover, the first sample has no particular problem such as film peeling, and an excellent result can be obtained in a deposition characteristic as well.

Figure 5:
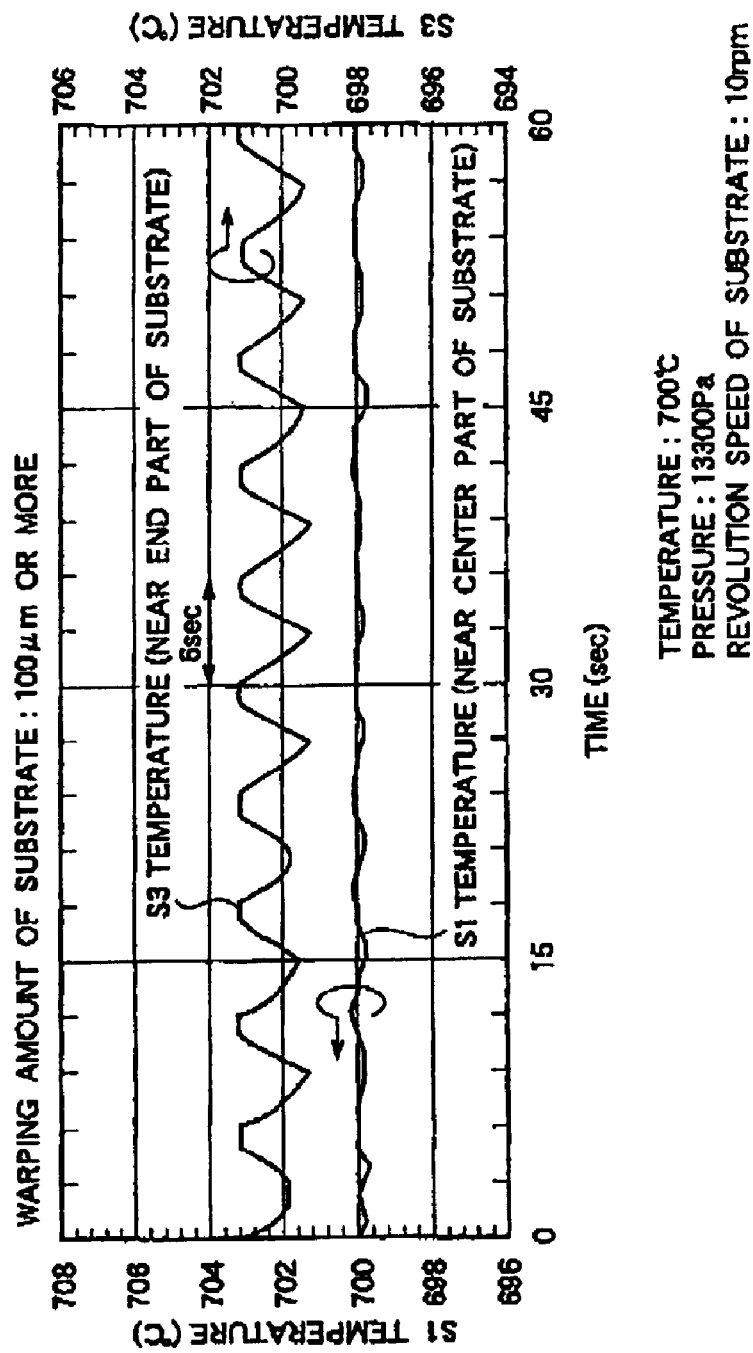
FIG. 5 is an explanatory view showing a dependence of the temperature distribution of the substrate holding plate on the warping amount of the substrate.

Next, the warping amount of the substrate 1 is measured by a known means before the processing in advance and the one whose warping amount is equal to or larger than 100 μm is used as a second sample to obtain the temperature of the substrate holding plate 2 from the rear surface side, similarly to the above. The results are shown in FIG. 5. In FIG. 5, the time transition of the temperature S1 near the center part of the substrate demonstrates a tendency similar to that in FIG. 4, but as to the time transition of the temperature S3 near the end part of the substrate, variations within a width of about 2° C. with a minimal value of about 700° C. are observed with periodicity depending on a revolution number of the substrate.

Moreover, as to in-plane temperature distribution of the substrate holding plate 2 at this time, a tendency is demonstrated that it depends on unevenness of in-plane temperature distribution of the substrate 1 as shown in FIGS. 6A and 6B. It should be mentioned that FIG. 6A shows the in-plane temperature distribution of the substrate and FIG. 6B shows the in-plane temperature distribution of the substrate holding plate, respectively. Incidentally, as to the temperature distribution of FIG. 6A, the temperature of the substrate is assumed and distributed based on distribution of a film thickness formed on the substrate. A P-point on the substrate 1 corresponds to a P'-point on the substrate holding plate 2, and a tendency is demonstrated that the temperature of the substrate becomes low where the temperature of the substrate holding plate 2 is high. It is assumed that this unevenness of the temperature distribution is due to the warping amount of the substrate 1, and it is figured out that the temperature of the substrate holding plate 2 depends on the warping amount of the substrate 1 and there is the correlation between the warping amount of the substrate and the temperature of the substrate holding plate 2.

[Consideration About the Correlation Between the Temperature of the Substrate Holding Plate and the Warping Amount of the Substrate]

In this embodiment, the resistance heater 3 is controlled so as to maintain heater temperature which is optimized in advance at all times, in order to heat the substrate 1 to predetermined temperature. Namely, a constant heat source Q is supplied at all times from the resistance heater 3 to the substrate holding plate 2 including the substrate 1. It should be mentioned that, when a distance d between the substrate 1 and the substrate holding plate 2 (refer to FIG. 1) is 0 (d=0), the aforementioned heat source Q contributes to heating of the substrate 1 and the substrate holding plate 2, according to known physics, the thermodynamic constant. However, in the case where d≠0, that is, when the substrate does not exist in the extreme example, the heat source Q contributes only to heating of the substrate holding plate 2, and hence the temperature of the substrate holding plate 2 maintains to be higher than the case where d=0. Moreover, as to the temperature of the substrate in the case where d≠0, heat loss due to a spatial medium increases and the temperature of the substrate decreases as the distance d becomes longer, as is clear from the tendency of the in-plane distribution in FIGS. 6A and 6B. Therefore, there is the correlation between the warping amount of the substrate and the temperature of the substrate holding plate, and its relation is supposed to become roughly the one shown in FIG. 7.

As described above, since there is the correlation between the warping amount of the substrate and the temperature of the substrate holding plate, it is possible to indirectly monitor the warping amount of the substrate during the processing by directly monitoring the temperature of the substrate holding plate 2 during deposition by the radiation thermometers S1 to S3. The warping amount of the substrate is determined by calculation using a correlation expression, or calculated using a lookup table. Thereby, it is possible to manage a contact area between the substrate and the substrate holding plate, which cannot be managed in the conventional example, and to quantitatively obtain managing data of the warping amount of the substrate during the processing. As a result, examining causes is facilitated when a defect is caused due to the warping amount.

Since the substrate holding plate 2 is rotated with respect to the radiation thermometers S1 to S3, it is possible to measure the temperature at all points in the circumferential direction of the substrate holding plate 2 successively, only by providing one radiation thermometer on the same circumference of the substrate holding plate 2. Further, from a rotation start point and a rotation time (cycle), it is possible to figure out at which part of the circumferential direction of the substrate holding plate and how it is warped. As a result, examining the causes is further facilitated when the defect is caused due to the warping amount.

When the causes of the defect can be examined and the relationship between the warping amount and the defect can be analyzed by the managing data, it is possible to move a step forward to control the warping amount of the substrate so as not to cause the defect by controlling the temperature of the substrate holding plate 2 during the processing. The temperature of the plate holding plate 2 can be easily controlled by controlling the passage of a current through the resistance heater 3 by the calculator 25 and the control means 26. Thereby, an optimum warping state of the substrate which is required for processing nondefective item can be realized. As a result, it is possible to improve uniformity of the film thickness in the thin film forming processing.

Furthermore, since the temperature of the substrate holding plate 2 is measured from the rear surface side of the substrate holding plate 2 by the radiation thermometers S1 to S3, the sensor parts of the radiation thermometers are covered with the substrate holding plate 2, and therefore, it is possible to avoid them from being exposed to processing space. Hence, in contrast to the thermometer which exposes itself to the processing space to measure the temperature on the surface of the substrate, a film is not adhered to the sensor parts of the radiation thermometers and, as a result, it is possible to increase a long-term reliability as the apparatus.

Incidentally, in the above-described embodiment, the sample example whose warping amount of the substrate before the processing is 100 μm and whose variations of the temperature of the substrate holding plate are within the width of about 2° C. is used. However, since no small substrate contraction and expansion are caused due to the heat in the substrate during the processing, the warping amount of the substrate during the processing may not necessarily be the one before the processing. Further, the correlation values between the variations of the warping amount of the substrate and the temperature of the substrate holding plate are not necessarily constant, and they may show the various values according to different material and structure of the processing container, the substrate holding plate and the like. However, it is possible to clarify the condition for defect prediction of the substrate by optimizing a dependence of the warping amount of the substrate on the temperature of the substrate holding plate, regardless of the various materials and structures.

In the above-described embodiment, the present invention is explained from the perspective on how to process the substrate without warping it. Hereinafter, another embodiment of processing the substrate by warping it on purpose will be explained from a different perspective.

As shown in FIGS. 8A and 8B, a substrate 1 which is mounted on a substrate holding plate 2 and a film 13 which is formed on the substrate 1 are warped under the influence of heat, during processing of increasing temperature (A). After the processing, when the substrate 1 is removed from a processing container and is back to room temperature, the warps of the substrate 1 and the formed existing film 13 are restored (B). When it is thus back to the room temperature, film peeling is caused. It is possible that a secondary disaster is caused by the peeled film becoming particles and contaminating the processing apparatus. This tendency becomes more pronounced in a laminated structure film which undergoes a plurality of thin film forming processes and, in a semiconductor manufacturing process in which a plurality of the thin film forming processes are unavoidable, it is preferable to reduce residual stress in each of a plurality of the thin film forming processes as small as possible. It should be noted that, by reducing the residual stress, it is possible to produce effects from the viewpoint of an electrical characteristic of an apparatus, that is, a leakage current is reduced and dielectric strength is increased.

In order to avoid the film peeling by reducing the residual stress, it may be better for some of the existing films to warp the substrate on purpose during the processing of increasing the temperature, or to process the substrate while maintaining a predetermined warping state by using a monitored warping amount during the processing. As shown in FIG. 9, when the substrate 1 is back to the room temperature, stress (extension amount) during deposition shown by -> is offset by stress (extension amount) under the room temperature shown by . . . >, whereby unnecessary stress is not caused in the film and the film peeling can be avoided. Namely, in order to offset the residual stress in the film, it is necessary to warp the substrate on purpose.

Figure 15:
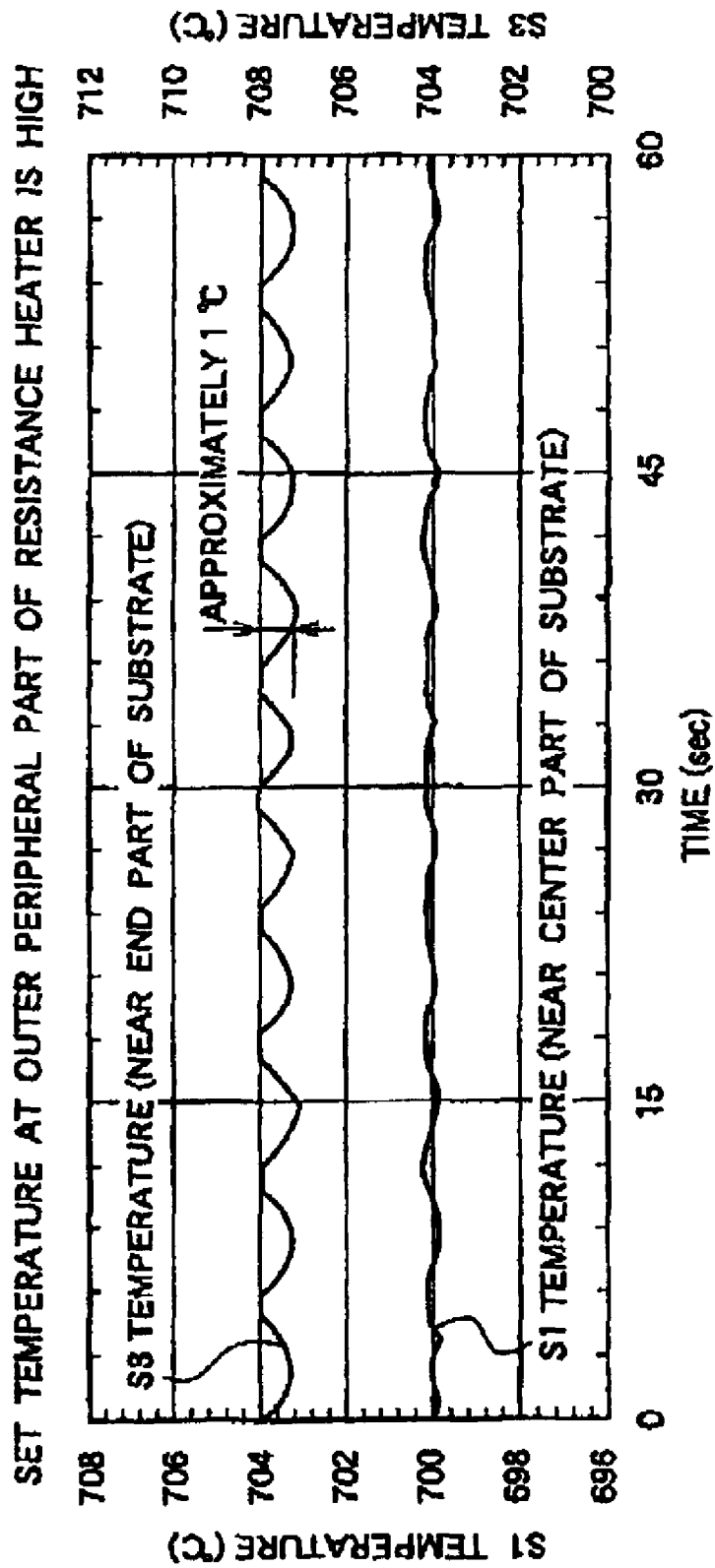
FIG. 15 is an explanatory view showing a dependence of temperature distribution of the substrate holding plate on elastic deformation of the substrate.
Figure 16:
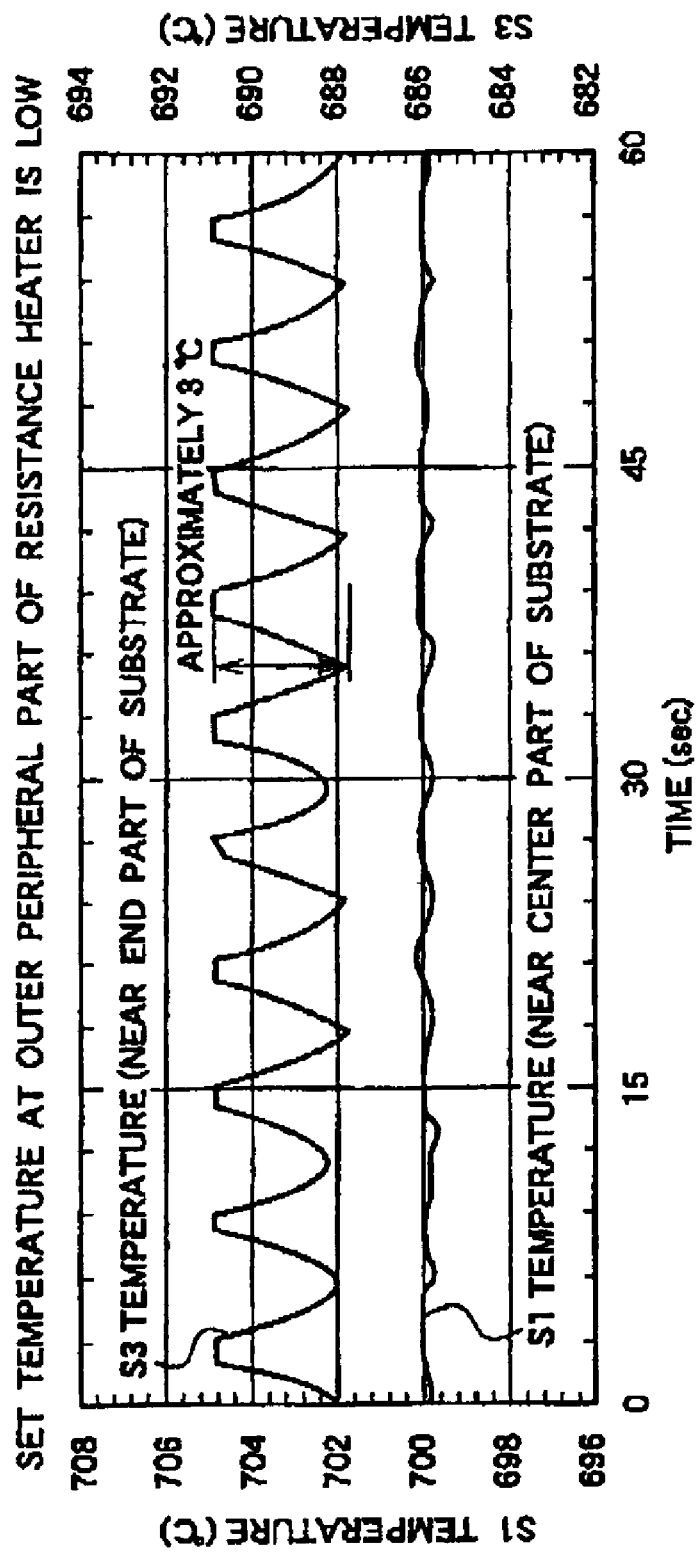
FIG. 16 is an explanatory view showing the dependence of the temperature distribution of the substrate holding plate on the elastic deformation of the substrate.

Hereinafter, elastic deformation of the substrate (a temporary warp during the processing, not a warp of the substrate before the processing) will be explained by using experimental data in FIG. 15 and FIG. 16. FIG. 15 and FIG. 16 show time transitions of the temperature of the substrate holding plate when set temperature at the outer peripheral part of a resistance heater is changed with reference to the data in FIG. 5. FIG. 15 shows the case where the set temperature at the outer peripheral part of the resistance heater is set to be higher than the reference value, and FIG. 16 shows the case where the set temperature is set to be lower than the reference value. In FIG. 15, variations of temperature S3 near the end part of the substrate become smaller than those shown in FIG. 5, and the variations are within a width of about 1° C. with a maximum value of 708° C., with periodicity depending on a revolution number of the substrate. In contrast to FIG. 15, in FIG. 16 in which the set temperature at the outer peripheral part of the resistance heater is lowered, variations of temperature S3 near the end part of the substrate become larger, and the variations are within a width of about 3° C. with a minimal value of 688° C. According to the above-described consideration, the variations of the temperature S3 mean that an adhesion d (refer to FIG. 1) between the substrate 1 and the substrate holding plate 2 changes along a circumferential direction according to the temperature value, and it is conceivable that the elastic deformation (warp) is generated in the substrate according to the temperature change at the outer peripheral part of the resistance heater.

A mechanism of generating the elastic deformation in the substrate will be considered. An amount of thermal expansion of the semiconductor substrate during the processing depends on heating temperature and material of the substrate, and a volume of the substrate generally increases as compared with a state before heat treatment. When the temperature at the outer peripheral part of the substrate is higher than the temperature at the center part of the substrate, the amount of thermal expansion is larger in the outer peripheral part of the substrate than in the center part, and stress to deform the entire substrate protrusively toward a direction opposite to the substrate holding plate 2 is generated (FIG. 10). In contrast, when the temperature at the outer peripheral part of the substrate is lower than the temperature at the center part, the amount of thermal expansion is larger in the center part of the substrate, and hence the substrate is deformed concavely toward the direction opposite to the substrate holding plate 2 (FIG. 11). Thus, by setting a certain temperature gradient for the temperature at the center part of the substrate and at the outer peripheral part thereof, it is possible to generate the temporary elastic deformation, that is, the warp, in the substrate 1 during the heat treatment, and to control an amount of the elastic deformation of the substrate 1, that is, the warping amount of the substrate, according to a change amount of the temperature gradient.

It is possible to use the apparatus whose structure is the same as that of the above-described embodiment as a means for offsetting the residual stress in the film according to another embodiment, However, a heater of a separated type should be adopted as the resistance heater 3 so that the set temperature of an inner peripheral part and an outer peripheral part of the heater can be separately set corresponding to the inner peripheral part and the outer peripheral part the substrate holding plate 2, respectively.

This control can be realized by the aforesaid substrate processing apparatus, which is shown in FIG. 1, including the calculator 25 for determining the warping amount of the substrate and the control means 26 for controlling the resistance heater 3 according to the warping amount determined by the calculator 25 to thereby control the warping state of the substrate 1. In this case, a command value supplied from the calculator 25 to the control means 26 is not for correcting the warping amount of the substrate, but for setting the certain temperature gradient for the temperature at the center part of the substrate and at the outer peripheral part thereof, and for producing the warping amount of the substrate on purpose according to the change amount of the temperature gradient. Thereby, it is possible to process the substrate 1 while maintaining the predetermined warping state which is controlled by the control means 26.

In concrete, in the thin film forming process in which shrinkage stress is generated in the film after the thin film formation and the entire substrate is deformed concavely toward the direction opposite to the substrate holding plate, the substrate during the heat treatment is processed while generating the protrusive elastic deformation (warp) on the opposite side to the substrate holding plate, thereby offsetting the residual stress in the film after the processing. Similarly, in the thin film forming process in which opposite stress is generated, the substrate is processed while generating the concave elastic deformation on the opposite side to the substrate holding plate, thereby allowing to offset the stress after the processing.

Incidentally, in the above-described another embodiment, the example of controlling the warping amount of the substrate so as to offset the residual stress in the formed film, but it is needless to say that it is possible to control it so as to generate the residual stress on purpose in the formed film.

Technical ideas and these effects which can be figured out from the above-described embodiments, except for claims, will be described below.

(1) As a semiconductor manufacturing apparatus, it is preferable to control the adhesion between the substrate and the substrate holding plate and the warping amount of the substrate by setting the temperature gradient in a radial direction of the substrate based on temperature information of the substrate holding plate. According to this structure, it is possible to generate the temporary elastic deformation, that is, the warp, in the substrate during the heat treatment, and to control the amount of the elastic deformation of the substrate, that is, the warping amount of the substrate, according to the change amount of the temperature gradient.

(2) As a method for manufacturing a semiconductor device, it is preferable, in forming the thin film on the substrate, to ease the stress in the film after the thin film formation by performing the processing while generating the elastic deformation which corresponds to the stress in the film after the thin film formation in the substrate on purpose. According to this structure, the film peeling is not caused when the substrate is back to the room temperature, and it is possible to effectively prevent the peeled film from becoming the particles and contaminating the processing apparatus.

According to the present invention, it is possible to control the warping amount of the substrate during the processing and to examine the causes of the defect due to the warping amount easily and quantitatively, by indirectly monitoring the warping amount of the substrate. Further, in controlling the warping amount, the substrate can be processed while reducing the warping amount of the substrate.

Moreover, the thin film processing is performed while changing the temperature of the substrate based on the temperature information of the substrate holding plate and generating the elastic deformation in the substrate on purpose, which makes it possible to control the stress in the film during the thin film formation and to contribute to improvement of yields of the semiconductor device.

What is claimed is:

1. A substrate processing apparatus which processes a substrate, comprising:

a substrate holding body which holds the substrate;

a heater which heats the substrate through said substrate holding body;

at least one thermometer extending through said heater, which measures temperature of said substrate holding body from a rear surface side of said substrate holding body without contacting with said substrate holding body, which is opposite to a surface side on which the substrate is held;

a monitor which monitors a warping amount of the substrate having a correlation with the temperature of said substrate holding body, based on the measured value of said at least one thermometer; and a rotator which rotates said substrate holding body relatively to said at least one thermometer, wherein said at least one thermometer measures the temperature of the rear surface of said substrate holding body in a circumferential direction, which is rotated relatively to said at least one thermometer by said rotator, and wherein said monitor monitors the warping amount of the substrate in the circumferential direction, based on the measured value of said at least one thermometer.

2. The substrate processing apparatus according to claim 1, wherein said monitor is comprised of a calculator which determines the warping amount of the substrate according to a predetermined algorithm, from the temperature of said substrate holding body measured by said at least one thermometer.

* * * * *